United States Patent [19]
Hwang et al.

[11] Patent Number: 5,783,025
[45] Date of Patent: Jul. 21, 1998

[54] OPTICAL DIEBONDING FOR SEMICONDUCTOR DEVICES

[75] Inventors: Ming Hwang. Richardson; Leslie E. Stark; Gonzalo Amador. both of Dallas, all of Tex.

[73] Assignee: Texas Instruments Incorporated. Dallas, Tex.

[21] Appl. No.: 743,691

[22] Filed: Nov. 6, 1996

Related U.S. Application Data

[63] Continuation of Ser. No. 255,197, Jun. 7, 1994, abandoned.

[51] Int. Cl.$^6$ .......................... B32B 31/00; G05G 15/00
[52] U.S. Cl. ................ 156/359; 156/379.8; 156/380.9; 156/382; 156/497; 219/85.12; 250/505.1; 392/408
[58] Field of Search .............................. 156/359, 379.6, 156/379.8, 380.9, 382, 497, 498; 219/85.12; 250/505.1; 359/288, 350, 885; 392/408; 432/12

[56] References Cited

U.S. PATENT DOCUMENTS

| | | | |
|---|---|---|---|
| 3,374,531 | 3/1968 | Bruce | 29/498 |
| 3,586,813 | 6/1971 | Graham et al. | 219/85 |
| 3,661,369 | 5/1972 | Costello | 263/2 R |
| 3,718,800 | 2/1973 | Costello | 219/85 |
| 3,775,219 | 11/1973 | Karlson et al. | 156/363 |
| 3,836,745 | 9/1974 | Costello | 219/85 |
| 3,879,164 | 4/1975 | Haldopoulos et al. | 432/10 |
| 4,421,589 | 12/1983 | Armini et al. | 156/359 X |
| 4,481,708 | 11/1984 | Bokil et al. | 29/588 |
| 4,685,200 | 8/1987 | Bokil | 437/215 |
| 5,046,656 | 9/1991 | Schmitt et al. | 228/123 |
| 5,178,681 | 1/1993 | Moore et al. | 118/715 |
| 5,208,467 | 5/1993 | Yamazaki | 257/667 |

FOREIGN PATENT DOCUMENTS

| | | |
|---|---|---|
| 55-183896 | 12/1980 | Japan . |
| 1042136 | 2/1989 | Japan .......................... 52/12 |

OTHER PUBLICATIONS

Product Description Expert from Product Description Manual for Exair-Amplifiers, entitled: *Exair Section 6*; produced for Exair Corporation, 1250 Century Circle North, Cincinnati, OH 45246; pp. 27–32.

Product Description Brochure/Manual for: *Infrared Line Heater, Model 5193*, produced for Research Inc., Box 24064, Minneapolis, MN, 55424, Printed in U.S.A.© Research, Inc. 1990 5505-D-02-B; 4 pp.

IBM Technical Disclosure Bulletin, J.P. Kirk and C. A. Wasik, Chip Motion Monitor, vol. 21 No. 10, Mar. 1979, p. 4041.

IBM Technical Disclosure Bulletin, Infrared Brazing, vol. 29 No. 5, Oct. 1986, p. 2129.

IBM Technical Disclosure Bulletin, C. DiGiacomo and G.R. Parker, Prevention of Land Opens During Infrared Rework of Chips, vol. 21 No. 8, Jan. 1978, pp. 3216–3217.

IBM Technical Disclosure Bulletin, B.C. Henry and D.A. Jeannotte, Semiconductor Structure with Integrated Infrared Energy Absorption Layer, vol. 22 No. 2, Jul. 1979, p. 681.

IBM Technical Disclosure Bulletin, R.F. Lever, Applying Radiant Heat to Semiconductor Integrated Circuits, vol. 20 No. 10, Mar. 1978, pp. 3908–3909.

IBM Technical Disclosure Bulletin, Use of Diffused Infrared Lamp "Heat" for Chip Join–C4 Reflow, vol. 36 No. 10, Oct. 1993, p. 71.

*Primary Examiner*—David A. Simmons
*Assistant Examiner*—Paul M. Rivard
*Attorney, Agent, or Firm*—Robby T. Holland; Richard L. Donaldson

[57] ABSTRACT

Semiconductor die attach occurs by bonding the semiconductor die to a support member such as a lead frame. An optical heat source provides heat for bonding the die attach material. An exhaust system removes vapors from the die attach material during bonding. A tungsten halogen lamp is an exemplary optical heat source. An air amplifier is exemplary to provide exhaust pressure. An exhaust manifold having a plurality of screens spreads the exhaust pressure over the width of the lead frame. A gas shower disposed over the lead frame aids in removing vapors.

4 Claims, 3 Drawing Sheets

OPTICAL DIEBONDING FOR SEMICONDUCTOR DEVICES

This application is a Continuation of application Ser. No. 08/255,197, filed Jun. 7, 1994, now abandoned.

CROSS REFERENCE TO RELATED APPLICATIONS

This application is related to simultaneously cofiled application Ser. No. 08/225,200 entitled "Optical Curing Process for Intergrated Circuit Package Assembly".

FIELD OF THE INVENTION

The invention relates generally to the field of semiconductor manufacturing, more particularly to "back end" assembly, and in particular to chip (die) attach.

BACKGROUND OF THE INVENTION

The manufacturing of packaged integrated semiconductor devices occurs generally in two stages known as "front end" processing and "back end" processing. "Front end" processing deals with formation of various devices such as transistors, resistors, and capacitors on a semiconductor wafer. "Back end" processing deals with assembly and test. After formation of the various devices on the semiconductor wafer, the wafer is sliced into semiconductor dies, the dies are assembled into packages, and the packaged dies are tested. Although various packaging techniques exist, the two main techniques are ceramic packaging and plastic packaging. These techniques are described throughout *Microelectronics Packaging Handbook* by Rao R. Tummala and Eugene J. Rymaszewski, copyright 1989, and in particular in chapters 6–8 and 10.

While different ceramic packages exist, one common ceramic package is the lid sealed package. A semiconductor chip is attached to a ceramic base by a chip bond material. Wire bonds then connect the semiconductor chip to metal lines on the ceramic base. Leads are then brazed to the ceramic base and connected to the metal lines to provide external connection. Finally, a lid is attached by a seal to cover the semiconductor die and close the ceramic package. Plastic packaged devices are usually formed by attaching the semiconductor chip to a lead frame with a chip die attach material. The lead frame is typically metallic and includes a die support pad (that the semiconductor die is attached to) and lead fingers. Wire bonding then occurs where lead frame fingers are connected to bonding pads on the semiconductor die. Bond wires typically connect the lead fingers to the bonding pads. The adhesive holds the semiconductor die in place during the wire bonding process. Thereafter, encapsulation occurs with the lead frame and die being encapsulated in a plastic mold compound. The mold compound is cured and the lead frame trimmed and formed.

From above, it is seen that both ceramic packaged devices and plastic packaged devices require a chip bonding material to secure the chip to the underlying structure. Three broad categories of chip die attach materials currently exist: solders; organic adhesives; and, glass silver-fill. Exemplary of solders are Au—Si, Au—Sn, Au—Ge, Pb—Ag—In, and Pb—Sn metallic compositions. Ceramic packages most often use solder. Exemplary of organic adhesives are epoxies, polyimides (most frequently filled with silver) and thermoplastics such as acrylics, polyester or polyamides filled with metal. Table 8–5 on pages 556 and 557 of *Microelectronics Packaging Handbook* contains a listing of epoxy and polyimide chip polymer bonding adhesives. Plastic packaging may use either solder or organic bonding. Silver-filled specialty glass materials are exemplary of glass materials and are discussed in "A Critical Review of VLSI Die-Attachment in High Reliability Applications" by Shukla and Mancinger appearing in *Solid State Technology*, July 1985 page 67 et seq. Regardless of package type, the chip bonding material is heated to firmly secure the chip.

Page 554 of *Microelectronics Packaging Handbook* describes chip (die) attach in plastic packaging. In solder bonding, lead frames are fed from magazine holders along a track to a heater block. A small square of material (such as 6% Si, 94 Au) is cut from a feed ribbon and transferred to the chip support pad of the lead frame. The chip is placed onto the heated chip support pad by a collet. The chip and eutectic are scrubbed together by the collet, forming a hard alloy bond. The heater temperature is about 420° C. and the time for eutectic bonding is about 6–8 seconds. The heat transfer mechanism is by conduction. In polymer bonding, the metal filled epoxy or polyimide paste is typically applied to the lead frame die support pad by a print head. The die is pressed into the paste after printing. The paste is then cured to strongly adhere the lead frame to the semiconductor die. Epoxies and polyimides are organic thermosetting polymers that must be cured at elevated temperatures to complete the die bond. For many years, the industry standard epoxy cure process has consisted of placing the lead frames (with mounted dies) into heated ovens where it usually takes a minimum of about one hour for the resin to cure. Typical schedules are one hour at 150° C. for epoxies, and 30 minutes at 150° C., followed by 30 minutes at 275° C. for polyimides. In the oven cure process, heat transfer is by convection and the semiconductor die, epoxy resin, and lead frame are all uniformly heated to the temperature of the oven.

A relatively new epoxy snap cure process substantially speeds up polymer die attach curing from about an hour to about a minute. This snap cure process is depicted generally in prior art FIG. 1. In FIG. 1, a semiconductor die 4 is attached by an epoxy resin 6 to a metallic lead frame 8. Epoxy resin 6 is on the order of about 0.001 inches thick. A lead frame track rail 10 guides and holds lead frame 8 in place over a heater block 12. Heater block 12 includes a filament (unillustrated) that heats block 12 to a desired temperature, approximately 200° C., necessary to cure epoxy 6. Heat is transferred from heater block 12, to lead frame 8, to film 6 and to die 4 by conduction. Die 4, film 6 and lead frame 8 are all heated to the temperature of block 12. During heating, dry air 16 flows over the die 4, across the surface of lead frame 8, through lead finger cutouts (unillustrated) in lead frame 8, around heater block 12, and out through an exhaust 18. The air flow aids in lowering harmful effects of the gasses released by the die attach during die attach cure. Out gassing can result in contamination on bond pads of die 4 and lead to wire bonding and reliability problems. A large squirrel cage electromechanical AC motor provides exhaust vacuum 18. Hitachi Tokyo Electronics Co., Ltd. sells this rapid cure process in a piece of semiconductor manufacturing equipment called the "AC-050 In Line Epoxy Curing System". The AC-050 contains about 4 or 5 heater block platforms, each heater block 12 being about 10 inches long. Other commercially available snap cure apparatus employing heater block technology are manufactured by Syncrite and Moia.

While the AC-050 style apparatus illustrated in prior art FIG. 1 substantially reduces the amount of time needed to cure epoxy film 6 from about an hour to about a minute, the apparatus has several disadvantages. The AC-050 is a large unit, about 3 feet wide, 3 feet deep, and 4 feet high and thus occupies much valuable manufacturing floor space. The lead frame die attach pad can warp and be contaminated due to contact between the lead frame and heater block. Bond pads on the chip and the lead frame may be contaminated due to outgassing from the die attach material and high temperature of the lead frame. A new apparatus for rapid die attach is needed.

SUMMARY OF THE INVENTION

A rapid die attach cure apparatus employs an optical heat source such as a tungsten halogen lamp to heat the die attach material. An exhaust assembly employs an air amplifier and a multiple screen diffuser to efficiently remove outgassing and particulates from the die attach material. The apparatus can be used as a stand alone device, or it can be attached to a die bonder or a wire bonder because of its small size.

DETAILED DESCRIPTION OF PREFERRED EMBODIMENT

Figure 2:
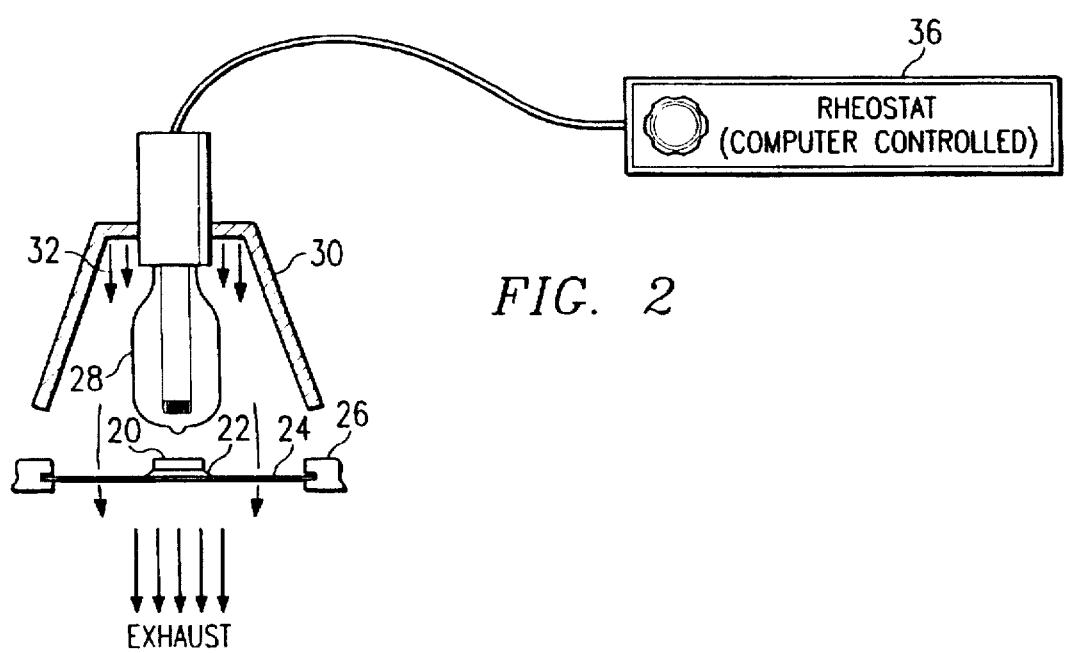
FIG. 2 is drawing conceptually illustrating an inventive optical rapid die attach cure apparatus and method.

FIG. 2 is a drawing conceptually illustrating an inventive optical rapid cure die attach apparatus and method. In FIG. 2, a semiconductor die 20 is attached by a die attach material 22 to a lead frame 24. Die attach material 22 is representative of die attach materials and includes solders, organic adhesives, and glass specialty materials. Examples of lead frame materials include copper, alloy 42, palladium/copper, and nickel copper. A lead frame track rail 26 guides and holds lead frame 24 in place underneath an optical heat source 28. Lead frame track rail 26 is adjustable to hold different sizes of lead frames. A typical lead frame 24 that holds one row of die may be about 1.25 inches wide. High density lead frames, such as MATRIX lead frames may hold several rows of dies and are much wider. Optical heat source 28 generates the energy that is used to heat die attach material 22. Polymer bonding may be accomplished very quickly, such as for example, with about a 1 minute exposure to optical heat source 28 while inorganic bonding, such as silicon/gold eutectic bonding, may be accomplished rapidly also. Heat is transferred from die 20 to die attach 22 and to the die support pad of lead frame 24. The portion of lead frame 24 not covered by die attach 22 and die 20 substantially reflects light radiation from optical heat source 28. For organic die attach with copper based lead frames and normal die size, this is particularly advantageous as the rails and fingers of lead frame 24 remain much cooler than die 20 during die cure. As an example, a 1 minute exposure to optical heat source 28 may result in die 20 being heated to about 200° C. while lead frame 24 is heated to only about 125° C.. As such, optical heat source 28 selectively heats die 20. Principal heat transfer occurs by radiation and the temperature response of the die attach is advantageously a smooth transient. Temperature profiles can be readily controlled during cure by varying the current through the lamp. In the prior art heater block method, however, heat transfer is through conduction which results in a step function like temperature response. Resident heat in the heater block precludes rapid cooling which is needed for thermoplastic die attach. Rapid optical heating allows rapid thermal response and can be used with thermoplastic die attach materials.

While more details regarding optical heat source 28 of FIG. 2 are provided later with reference to FIG. 3, it is believed that optical heat source 28 is preferably a lamp of the type that emits near infrared light. Exemplary lamp examples include incandescent halogen lamps of the tungsten type and xenon type. Infrared light wavelengths range from just under 0.8 microns to around about 2.8 microns. It is believed that silicon chip 20 has good absorption in the near infrared spectrum. The energy of the tungsten halogen light, for example, is absorbed more by silicon chip 20 than by lead frame 24 which has a higher incidence of reflection than chip 20. The silicon chip 20, with die attach 22, is heated by radiation to a higher temperature than lead frame 24 due to selective heating.

Figure 1:
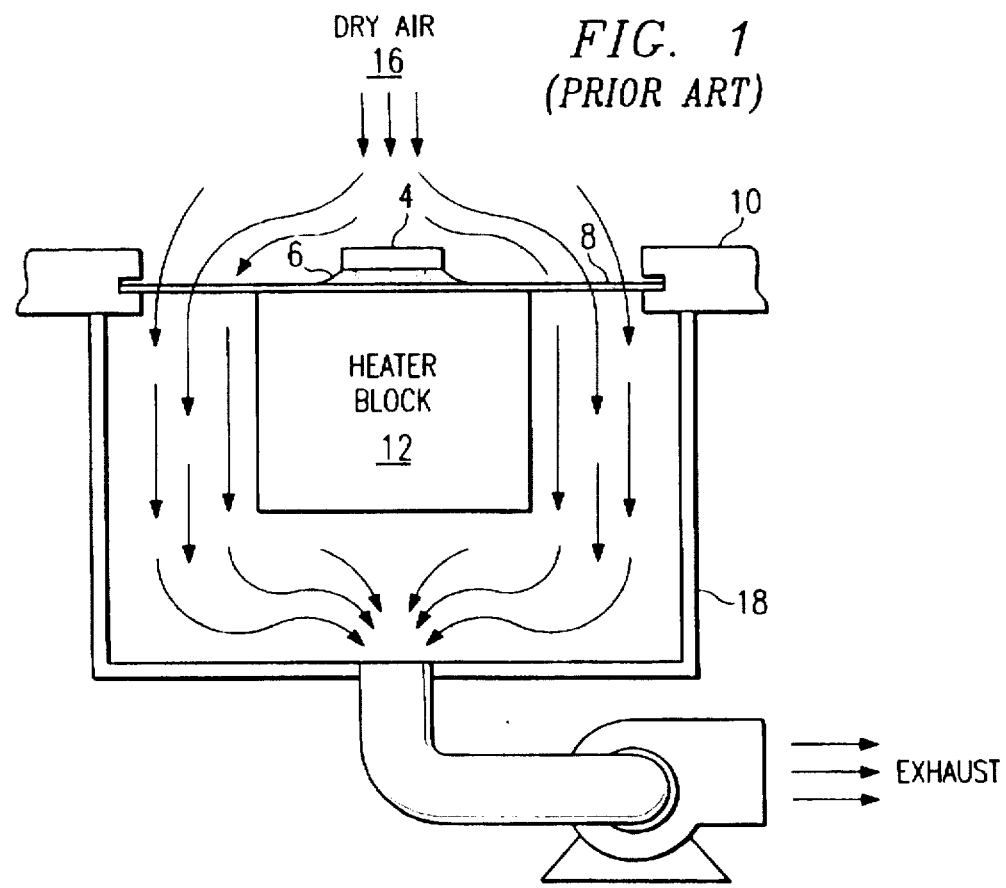
FIG. 1 is a prior art drawing illustrating the heater block snap cure polymer bond method.

Referring still to FIG. 2, a reflector 30 helps direct emissions from lamp 28 towards lead frame 24. Preferably the emissions are directed over the width of the lead frame so that uniform heating occurs. The light is spread over the lead frame area as opposed to being focused on the semiconductor chip. Dry air 32 flows over the die 20, through lead finger cutouts (unillustrated) in lead frame 24 and out exhaust outlet 34. Unlike FIG. 1's heater block 12, no obstruction exist underneath lead frame 24 of FIG. 2 to block air flow. Purge air 32 is able to flow over die 20 and through lead frame 24 more closely to the edge of die 20 substantially increasing the evacuation of harmful outgassing effects and epoxy fragments. The intensity (power) of lamp 28 may be controlled by a rheostat 36 or SCR which in turn may be computer controlled. This advantageously allows lamp power to be profiled or turned on and off with immediate energy response in contrast to the heater block of prior art FIG. 1 which is effectively unprofitable during snap cure because of its thermal mass. Instant lamp power adjustment aids in energy profiling that may be desirable in cases where some die bond materials need time to reach final cure temperature in order for volatiles to escape.

Figure 3:
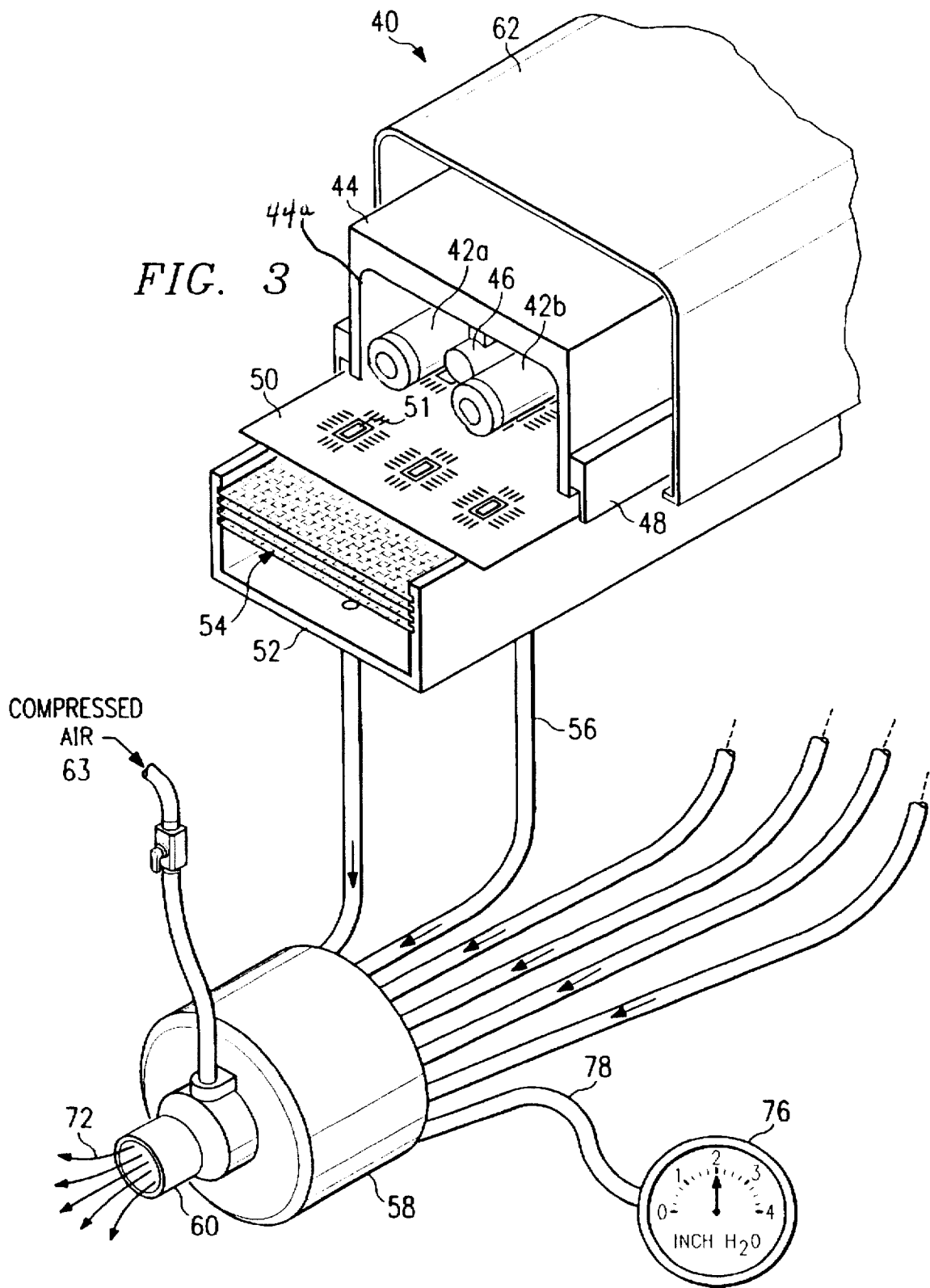
FIG. 3 is a partial isometric drawing illustrating a preferred embodiment optical rapid die attach cure apparatus.

Referring now to FIG. 3, a preferred embodiment of an optical rapid cure apparatus 40 is disclosed. Apparatus 40 contains an optical heat source 42 (illustrated as lamps 42a and 42b) attached to a reflector housing 44. A gas shower 46 is also attached to reflector housing 44. Lead frame track rails 48 hold and guide lead frame 50 below optical heat source 42. An exhaust manifold 52 having screen diffusers 54 is positioned below lead frame 50. Exhaust manifold 52 is connected by hoses 56 to an amplifier manifold 58 to which an air amplifier vacuum generator 60 is connected. A shroud 62 may cover reflector housing 44 for safety. A lead frame index mechanism (unillustrated) may be provided and controlled by die bonding equipment, or wire by bonding equipment, or by computer and process control equipment. Although optical rapid cure apparatus 40 may be configured as a stand alone piece of back end manufacturing equipment, a major advantage is the small size of the assembly. The reflector 44 and exhaust manifold 52 assembly is on the order of about 10.5 inches long, 3 inches wide, and 3 inches high. The small size allows the apparatus to be configured on a die bonder. It may be placed downstream on the die bonder post die application. The small size allows the apparatus to be configured on a wire bonder. It may be placed upstream of the bonder head. Thus, the apparatus may be used effectively with existing manufacturing space and use of controllers resident with die bond or wire bond equipment. Additionally, it may be used to link the die bond equipment and wire bond equipment.

In FIG. 3, optical heat source 42 is preferably a lamp of the type whose energy is reflected by the metal lead frame 50. A tungsten halogen lamp is exemplary. Such lamps are commercially available and made by General Electric, Osram-Sylvania, and Ushio. Off the shelf available wattages range from about 1000–2000 watts, 120 or 240 VAC, with 12 inch length and a diameter of about 0.4 inches. Custom bulbs are available in 10 inch length, 600–800 watts, 110 VAC, or other desired length configuration as required by the lead frame and equipment length. Bulb mounting plates at the ends of reflector 44 position the bulbs within the reflector. The mounted bulbs extend above lead frame 50. The height of the mounted bulbs above lead frame 50 may be adjusted with the effect controlled by light intensity. It is desirable to position the bulbs within the reflector housing 44 so that temperature across the width of the lead frame is uniform. The distance between bulbs 42 and lead frame 50 is about 0.78 inches. While optical heat source 42 as illustrated contains 2 lamps, single lamp sources are sufficient. The width of lead frame 50 may govern whether single or multiple lamps are better. Multiple lamps may be better suited for wider lead frames 50 while a single lamp may be suitable for the typical lead frame width of about 1.25 inches.

In FIG. 3, reflector housing 44 may consist of a metal block having a recess 44a formed therein for placement of lamp 42. Aluminum is a suitable metal for reflector housing 44 because of its reflectivity. Polishing recess 44a provides for better reflection of emissions from lamp 42 to semiconductor chips 51 attached to lead frame 50. Although not illustrated, the reflector housing may have slits in the top to aid cooling. Reflector housing 44 also holds gas shower 46. Gas shower 46 is a tube having apertures therein so that a gas may be dispersed over lead frame 50 during die attach cure. The tube may be metal, such as aluminum, and in the apparatus illustrated, is about 0.25 inches in diameter, about 8.5 inches long, and has apertures spaced about 0.10 inches apart. Shower 46 has a mounting bracket (unillustrated) and is screwed into reflector 44. Dry air is a suitable gas for dispersion as is nitrogen. Gas dispersion rate is optimized depending upon the amount of exhaust pressure used. In general, the less exhaust pressure used, the lower the necessary dispersion rate. Gas flow of 20 scfh with exhaust vacuum of 1.5" $H_2O$ works well. The gas shower may be centered as shown or may be placed at an angle to provide turbulence of the gases in the vicinity of the die surface and bonding lands of the lead frame.

Still referring to FIG. 3, lead frame track rails 48 hold lead frame 50. The illustrated lead frame 50 is of the MATRIX type, about 2.00 inches wide, with three semiconductor chips 51 disposed across the width of the lead frame. As mentioned above, an important advantage of optical cure apparatus 40 is the small size which allows for mounting directly onto a wire bonding machine, such as the commercially available ABACUS III wire bonder manufactured by Texas Instruments Incorporated. Placing optical cure apparatus 40 upstream of the bonder head allows for more automation in the assembly process. The lead frame is fed into the bonder transport and into optical cure apparatus 40. Rapid polymer curing occurs in about 1 minute to adhere semiconductor dies 51 to lead frame 50. The bonder transport carries lead frame 50 from apparatus 40 to the bonder head where wire bonding occurs.

Referring still to FIG. 3, exhaust manifold 52 resides underneath lead frame 50. By removing heater block 12 of FIG. 1, the exhaust below lead frame 50 of FIG. 3 is unobstructed and much better outgassing removal is achieved. Exhaust manifold 52 contains diffuser screens 54. Slots in exhaust manifold 52 hold the diffuser screens 54 in place. The screens have apertures therein. The screens 54 are preferably formed of a rigid material, such as stainless steel, to withstand temperature and an exhaust vacuum. The bottom of exhaust manifold 52 has apertures therein for exhaust removal. The apertures are about 0.25 inches diameter and are spaced equally across the length of manifold 52. Six apertures are used in the preferred embodiment. The apertures are connected by hoses 56 to amplifier manifold 58. The hoses are preferably of equal size and equal length so that the same amount of air flows through each. Hoses having 0.25 inch diameter formed of silicone tubing about 20 inches long are able to withstand the high temperature exhaust. Manifold 58 is about 3 inches long and has an internal diameter of about 3 inches. Manifold 58 allows multiple exhaust apertures in manifold 52 to be connected to air amplifier 60.

Figure 4:
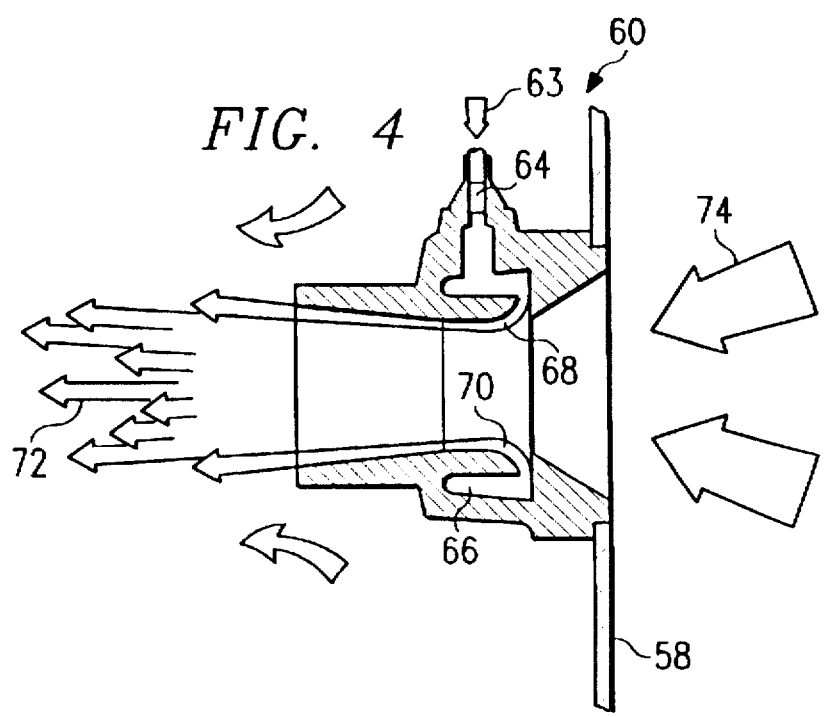
FIG. 4 is a drawing illustrating the air amplifier of FIG. 3.

In FIG. 3, an air amplifier 60 is connected to amplifier manifold 58. Air amplifier 60 is about 2.5 inches long and about 2 inches outside diameter. Air amplifiers are commercially available devices such as manufactured by Exair corporation, for example. With further reference to FIG. 4, an explanation of the operation of air amplifier 60 is provided. Compressed air 63 flows through an inlet 64 into an annular chamber 66. It is then throttled through a small ring nozzle 68 at high velocity. This primary air stream adheres to the Coanda profile 70, which directs it toward the outlet 72. A low pressure area is created at the entrance center 74 inducing a high volume flow of air into the exhaust air stream. A Magnehelic pressure monitor 76 (FIG. 3) attached by hose 78 to amplifier manifold 58 allows pressure to be monitored. Dwyer Instruments makes a suitable pressure monitor. Exhaust pressure is adjustable by varying the amount of compressed air 63 into air amplifier 60. An exhaust pressure between 1–3 inches of $H_2O$ works well to effectively remove outgassing. The air amplifier is compact and provides independent precision vacuum control. A common manufacturing space vacuum hookup may not be desirable as vacuum could vary depending upon the number of users connected.

With further reference to FIG. 3, air amplifier 60 generates a low pressure at amplifier manifold 58 that is sufficient to obtain flow over lead frame 50, which is at a higher pressure, through exhaust manifold 52. Screens 54 within exhaust manifold 52 add resistance to the exhaust flow and serve to spread the air flow from the apertures in the bottom of exhaust manifold 52 over the width of lead frame 50. Air flow across the screen closest to the bottom of exhaust manifold 52 tends to be centered as it travels towards the apertures. Providing multiple screens expands air flow so that at the top of exhaust manifold 52, air flow is sufficiently the same across the width of lead frame 50. Four screens are illustrated. Maintenance of diffuser 52 is easy by simply removing and cleaning/replacing screens 54.

The apparatus provides numerous advantages in the die attach including curing most polymers in about 1 minute. Selective heating is possible as the lead frame will remain cooler than the semiconducor die. Temperature profiling is possible. The die surface is clean because of efficient outgassing exhaust directly through the lead frame. The optical rapid cure apparatus is relatively simple, has a small footprint, is easy to operate and maintain, and is easy to implement in an automated integrated circuit packaging process flow. It can be attached onto existing die bond equipment or wire bond equipment without adverse electrical noise effects because of the nonelectrical vacuum system.

While the die attach lamp apparatus was described with example to adhering a semiconductor chip to a metal lead frame, such description is not limiting as the apparatus is applicable for bonding a semiconductor die in a ceramic package. As explained above, the apparatus is suitable for all types of chip bonding including eutectic bonding as well as polymer bonding.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An apparatus for curing an polymer die attach material to adhere a semiconductor die to a lead frame, comprising:

a near infrared lamp;

a reflector to direct emissions from the near infrared lamp across the width of the lead frame;

a beltless processing station including a lead frame track rail disposed under the lamp to retain the lead frame having the semiconductor die adhered thereto by the polymer die attach material, the lead frame track rail supporting the lead frame only on the sides that define the width of the lead frame; and an exhaust system in fluid communication with said processing station to remove outgassing from the polymer die attach material, the exhaust system including a diffuser screen to equalize exhaust vacuum across the width of the lead frame.

2. The apparatus of claim 1 further comprising a gas shower disposed over the lead frame track rail to direct a gas towards the semiconductor die.

3. The apparatus of claim 2 wherein the exhaust system comprises a nonelectrical exhaust system.

4. The apparatus of claim 3 wherein the nonelectrical exhaust system comprises:

a diffuser manifold having a plurality of apertures disposed underneath the lead frame track rail;

a plurality of hoses connected to the plurality of apertures;

an amplifier manifold connected to the plurality of hoses; and an air amplifier connected to the amplifier manifold.

* * * * *